(12) United States Patent
Kim et al.

(10) Patent No.: US 12,142,544 B2
(45) Date of Patent: Nov. 12, 2024

(54) SEMICONDUCTOR PACKAGE (71) Applicant: SAMSUNG ELECTRONICS CO., LTD., Suwon-si (KR)

(72) Inventors: Taehwan Kim, Hwaseong-si (KR); Young-Deuk Kim, Hwaseong-si (KR); Jae Choon Kim, Incheon (KR); Kyung Suk Oh, Seongnam-si (KR); Eungchang Lee, Hanam-si (KR)

(73) Assignee: Samsung Electronics Co., Ltd. (KR)

( * ) Notice: Subject to any disclaimer, the term of this patent is extended or adjusted under 35 U.S.C. 154(b) by 376 days.

(21) Appl. No.: 17/734,700

(22) Filed: May 2, 2022

(65) Prior Publication Data

US 2023/0096170 A1 Mar. 30, 2023

(30) Foreign Application Priority Data

Sep. 27, 2021 (KR) .................. 10-2021-0127487

(51) Int. Cl.
*H01L 21/00* (2006.01)
*H01L 23/00* (2006.01)
(Continued)

(52) U.S. Cl.
CPC ............ *H01L 23/481* (2013.01); *H01L 24/08* (2013.01); *H01L 24/09* (2013.01); *H01L 24/16* (2013.01); *H01L 24/17* (2013.01); *H01L 25/0657* (2013.01); *H01L 23/49816* (2013.01); *H01L 23/49833* (2013.01); *H01L 24/32* (2013.01);
(Continued)

(58) Field of Classification Search
CPC ........ H01L 23/481; H01L 24/08; H01L 24/09
See application file for complete search history.

(56) References Cited

U.S. PATENT DOCUMENTS 7,365,418 B2    4/2008  Hsu
7,598,617 B2 * 10/2009  Lee ..................... H01L 23/481
                                                                257/734
(Continued)

FOREIGN PATENT DOCUMENTS

CN    115881692 A  *  3/2023  ........... H01L 23/481
CN    116137264 A  *  5/2023  ......... H01L 23/5286
(Continued)

*Primary Examiner* — Laura M Menz
(74) *Attorney, Agent, or Firm* — Fish & Richardson P.C.

(57) ABSTRACT

A semiconductor package may include vertically-stacked semiconductor chips and first, second, and third connection terminals connecting the semiconductor chips to each other. Each of the semiconductor chips may include a semiconductor substrate, an interconnection layer on the semiconductor substrate, penetration electrodes connected to the interconnection layer through the semiconductor substrate, and first, second, and third groups on the interconnection layer. The interconnection layer may include an insulating layer and first and second metal layers in the insulating layer. The first and second groups may be in contact with the second metal layer, and the third group may be spaced apart from the second metal layer. Each of the first and third groups may include pads connected to a corresponding one of the first and third connection terminals in a many-to-one manner. The second group may include pads connected to the second connection terminal in a one-to-one manner.

20 Claims, 11 Drawing Sheets

(51) Int. Cl.
  *H01L 23/48* (2006.01)
  *H01L 25/065* (2023.01)
  *H01L 23/498* (2006.01)
(52) U.S. Cl.
  CPC .......... *H01L 24/73* (2013.01); *H01L 25/0655* (2013.01); *H01L 2224/0801* (2013.01); *H01L 2224/08058* (2013.01); *H01L 2224/08148* (2013.01); *H01L 2224/0903* (2013.01); *H01L 2224/09132* (2013.01); *H01L 2224/09133* (2013.01); *H01L 2224/16013* (2013.01); *H01L 2224/16014* (2013.01); *H01L 2224/16055* (2013.01); *H01L 2224/16059* (2013.01); *H01L 2224/1607* (2013.01); *H01L 2224/16148* (2013.01); *H01L 2224/1703* (2013.01); *H01L 2224/17055* (2013.01); *H01L 2224/17132* (2013.01); *H01L 2224/17133* (2013.01); *H01L 2224/32145* (2013.01); *H01L 2224/73204* (2013.01); *H01L 2225/06513* (2013.01); *H01L 2225/06517* (2013.01); *H01L 2225/06524* (2013.01); *H01L 2225/06544* (2013.01); *H01L 2924/1431* (2013.01); *H01L 2924/1436* (2013.01); *H01L 2924/1437* (2013.01)

(56) References Cited

U.S. PATENT DOCUMENTS

| | | | |
|---|---|---|---|
| 7,863,098 B2 | 1/2011 | Lange et al. | |
| 8,048,794 B2 | 11/2011 | Knickerbocker | |
| 8,426,959 B2* | 4/2013 | Park | H01L 25/105 |
| | | | 257/690 |
| 8,461,690 B2* | 6/2013 | Yoshida | H01L 23/3128 |
| | | | 257/774 |
| 8,709,879 B2* | 4/2014 | Park | H01L 21/56 |
| | | | 438/127 |
| 9,136,143 B2 | 9/2015 | Yu et al. | |
| 9,269,646 B2 | 2/2016 | Luo et al. | |
| 9,318,470 B2* | 4/2016 | Matsumura | H01L 25/0657 |
| 9,620,433 B2 | 4/2017 | Fisch | |
| 9,847,322 B2 | 12/2017 | Sung et al. | |
| 9,875,992 B2 | 1/2018 | Heo et al. | |
| 10,153,261 B2 | 12/2018 | Dogruoz et al. | |
| 10,319,702 B2* | 6/2019 | Park | H01L 25/117 |
| 10,573,579 B2 | 2/2020 | Chen et al. | |
| 10,741,526 B2* | 8/2020 | Park | H01L 25/50 |
| 10,811,389 B2 | 10/2020 | Yu et al. | |
| 10,872,835 B1 | 12/2020 | Yoo et al. | |
| 11,569,200 B2* | 1/2023 | Jeong | H01L 25/50 |
| 2007/0222050 A1* | 9/2007 | Lee | H01L 24/02 |
| | | | 257/E23.011 |
| 2011/0042797 A1* | 2/2011 | Park | H01L 21/563 |
| | | | 257/E23.06 |
| 2011/0147945 A1* | 6/2011 | Yoshida | H01L 23/3135 |
| | | | 257/774 |
| 2012/0319757 A1* | 12/2012 | Sato | H01L 25/0657 |
| | | | 327/419 |
| 2013/0203219 A1* | 8/2013 | Park | H01L 21/563 |
| | | | 438/126 |
| 2015/0340340 A1* | 11/2015 | Matsumura | H01L 25/0657 |
| | | | 257/777 |
| 2019/0051634 A1* | 2/2019 | Park | H01L 25/0657 |
| 2019/0237432 A1* | 8/2019 | Park | H01L 25/043 |
| 2019/0318990 A1* | 10/2019 | Nakagawa | H01L 24/17 |
| 2020/0051884 A1 | 2/2020 | Shekhar et al. | |
| 2020/0098719 A1* | 3/2020 | Park | H01L 23/3192 |
| 2021/0249382 A1* | 8/2021 | Jeong | H01L 24/32 |
| 2023/0096170 A1* | 3/2023 | Kim | H01L 23/481 |
| | | | 257/690 |
| 2023/0132272 A1* | 4/2023 | Oh | H01L 25/0657 |
| | | | 257/295 |
| 2023/0133322 A1* | 5/2023 | Kim | H01L 24/48 |
| | | | 257/737 |
| 2023/0139657 A1* | 5/2023 | Yeoh | H01L 23/49816 |
| | | | 257/690 |
| 2023/0154894 A1* | 5/2023 | Hwang | H01L 24/16 |
| | | | 257/621 |
| 2023/0163099 A1* | 5/2023 | Jeong | H01L 24/83 |
| | | | 257/777 |
| 2023/0178533 A1* | 6/2023 | Jeon | H01L 23/3157 |
| | | | 257/738 |
| 2023/0187380 A1* | 6/2023 | Joo | H01L 23/3128 |
| | | | 257/737 |
| 2023/0207414 A1* | 6/2023 | Cho | H01L 23/481 |
| | | | 257/668 |
| 2023/0420403 A1* | 12/2023 | Song | H01L 24/16 |
| 2024/0006272 A1* | 1/2024 | Kim | H01L 23/49838 |
| 2024/0030103 A1* | 1/2024 | Lee | H01L 25/0657 |
| 2024/0063167 A1* | 2/2024 | Chung | H01L 24/97 |
| 2024/0145416 A1* | 5/2024 | Choi | H01L 23/5283 |
| 2024/0162195 A1* | 5/2024 | Park | H01L 25/50 |
| 2024/0170440 A1* | 5/2024 | Choi | H01L 24/16 |
| 2024/0186277 A1* | 6/2024 | Park | H01L 24/73 |
| 2024/0186290 A1* | 6/2024 | Kim | H01L 24/32 |
| 2024/0186294 A1* | 6/2024 | Lee | H01L 24/32 |
| 2024/0194624 A1* | 6/2024 | Kim | H01L 23/5226 |
| 2024/0196618 A1* | 6/2024 | Kim | H10B 43/27 |
| 2024/0203960 A1* | 6/2024 | Lee | H01L 24/32 |

FOREIGN PATENT DOCUMENTS

TW 202314988 A * 4/2023 ........... H01L 23/481
WO WO-2023239188 A1 * 12/2023

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2021-0127487, filed on Sept. 27, 2021, in the Korean Intellectual Property Office, the entire contents of which are hereby incorporated by reference.

BACKGROUND

The present disclosure relates to a semiconductor package and, in particular, to a semiconductor package with through-substrate vias (TSVs).

Due to the rapid development of the electronic industry and the increase in the diversity of user needs, electronic devices are required to have reduced sizes and more functions. Accordingly, semiconductor devices used in the electronic devices are also required to have reduced sizes and more functions. In order to satisfy this requirement, a semiconductor package technology has been proposed in which a plurality of vertically-stacked semiconductor chips are connected using through-substrate vias (TSVs).

SUMMARY

An embodiment of the disclosure provides a semiconductor package that has an excellent heat-dissipation property in a vertical direction.

According to an embodiment of the disclosure, a semiconductor package may include a plurality of semiconductor chips vertically stacked and a first connection terminal, a second connection terminal, and a third connection terminal connecting the semiconductor chips to each other. Each of the semiconductor chips may include a semiconductor substrate including a first surface and a second surface, which are opposite to each other, an interconnection layer provided on the first surface of the semiconductor substrate, a plurality of penetration electrodes provided to penetrate the semiconductor substrate and connected to the interconnection layer, and a first pad group, a second pad group, and a third pad group provided on the interconnection layer. The interconnection layer may include an insulating layer and a first metal layer and a second metal layer, which are vertically stacked on the first surface of the semiconductor substrate and in the insulating layer. A thickness of the second metal layer may be larger than a thickness of the first metal layer. The first pad group and the second pad group may be in contact with the second metal layer, and the third pad group may be spaced apart from the second metal layer. The first pad group may include a plurality of first pads, and the first connection terminal may be connected to the first pads in a one-to-many manner. The second pad group may include a plurality of second pads, and the second connection terminal may be connected to the second pads in a one-to-one manner. The third pad group may include a plurality of third pads, and the third connection terminal may be connected to the third pads in a one-to-many manner.

According to an embodiment of the disclosure, a semiconductor package may include a first semiconductor chip, a second semiconductor chip on the first semiconductor chip, and a connection region between the first semiconductor chip and the second semiconductor chip. The first semiconductor chip may include a plurality of first penetration electrodes and a plurality of second penetration electrodes, and the second semiconductor chip may include an interconnection layer adjacent to the first semiconductor chip. The interconnection layer may include an insulating layer and a first metal layer and a second metal layer, which are vertically stacked in the insulating layer. The second metal layer may be thicker than the first metal layer. The connection region may include lower voltage pads and lower signal pads, which are adjacent to the second semiconductor chip and are in contact with the second metal layer, lower dummy pads, which are adjacent to the second semiconductor chip and are spaced apart from the second metal layer, upper voltage pads, which are adjacent to the first semiconductor chip and are connected to the first penetration electrodes in a one-to-many manner, upper signal pads, which are adjacent to the first semiconductor chip and are connected to the second penetration electrodes in a one-to-one manner, and upper dummy pads, which are adjacent to the first semiconductor chip and are spaced apart from the first and second penetration electrodes. The lower dummy pads of the second semiconductor chip may be connected to the upper dummy pads of the first semiconductor chip.

According to an embodiment of the disclosure, a semiconductor package may include a package substrate, an interposer on the package substrate, a first semiconductor chip on the interposer, and a package disposed adjacent to the first semiconductor chip. The package may include a plurality of second semiconductor chips which are vertically stacked and a first connection terminal, a second connection terminal, a third connection terminal, and fourth connection terminals connecting the second semiconductor chips to each other. Each of the second semiconductor chips may include a semiconductor substrate, a plurality of penetration electrodes provided to penetrate the semiconductor substrate, an interconnection layer provided on a surface of the semiconductor substrate, and a signal pad group, a power pad group, a ground pad group, and a dummy pad group provided on the interconnection layer. The signal, power, ground, and dummy pad groups may include signal pads, power pads, ground pads, and dummy pads, respectively. The first connection terminal may be in contact with the power pads in a one-to-many manner, and the second connection terminal may be in contact with the ground pads in a one-to-many manner. The third connection terminal may be in contact with the dummy pads in a one-to-many manner, and each of the fourth connection terminals may be in contact with a corresponding one of the signal pads in a one-to-one manner. An aspect ratio of one of the first to third connection terminals may be smaller than an aspect ratio of the fourth connection terminal.

DETAILED DESCRIPTION

Example embodiments of the disclosures will now be described more fully with reference to the accompanying drawings, in which example embodiments are shown.

Figure 1:
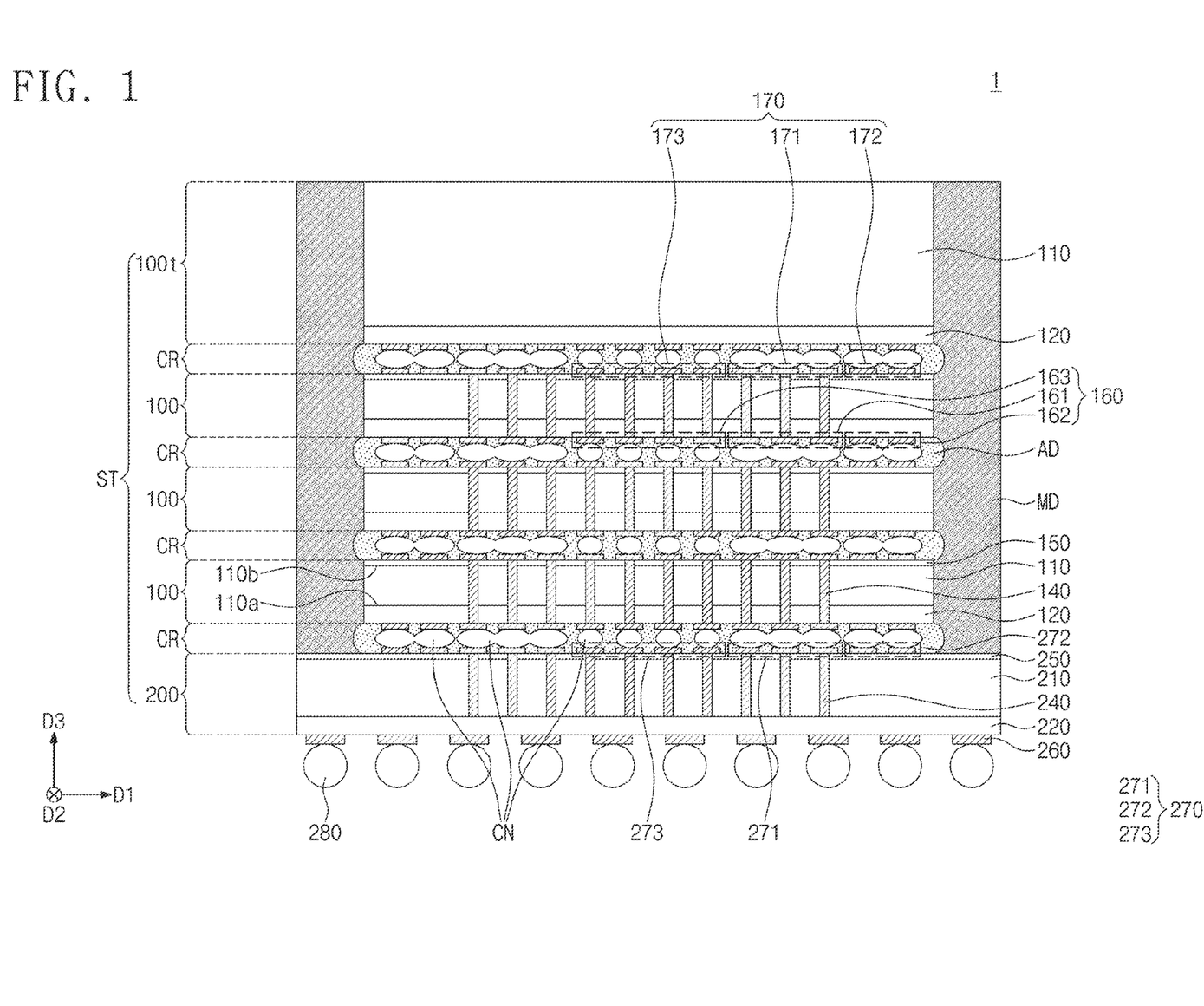
FIG. 1 is a sectional view schematically illustrating a semiconductor package according to an embodiment of the disclosure.

FIG. 1 is a sectional view schematically illustrating a semiconductor package 1 according to an embodiment of the disclosure.

Referring to FIG. 1, a package 1 may be provided and may be referred to as a semiconductor chip stack ST. The semiconductor chip stack ST may include a plurality of first semiconductor chips 100 and 100t, a second semiconductor chip 200, a molding member MD, and an adhesive layer AD, which is provided between the first semiconductor chips 100 and 100t and between the first semiconductor chip 100 and the second semiconductor chip 200.

The first semiconductor chips 100 and 100t may be stacked on a top surface of the second semiconductor chip 200 in a vertical direction. In an embodiment, at least one of the first semiconductor chips 100 and 100t may be a memory chip. The memory chip may be one of dynamic random access memory (DRAM) and static random access memory (SRAM) chips.

The second semiconductor chip 200 may be called a base chip or a buffer chip. In an embodiment, the second semiconductor chip 200 may be a logic chip. The logic chip may be one of graphics processing unit (GPU) and system on chip (SOC) chips.

The molding member MD may cover side surfaces of the first semiconductor chips 100 and 100t, the top surface of the second semiconductor chip 200, and side surfaces of the adhesive layers AD. In an embodiment, the molding member MD may be formed of or include an epoxy compound. Each of the first semiconductor chips 100 may include a first semiconductor substrate 110, an interconnection layer 120, a first protection layer 190 (e.g., see FIG. 2), a second protection layer 150, and first penetration electrodes 140.

In an embodiment, the first semiconductor substrate 110 may be formed of or include silicon. The first semiconductor substrate 110 may include a first surface 110a and a second surface 110b, which are opposite to each other. The interconnection layer 120 may be provided on the first surface 110a. The first protection layer 190 may be provided on a bottom surface of the interconnection layer 120. The first protection layer 190 may be formed of or include an insulating material (e.g., a silicon nitride layer).

First lower pad groups 160 may be provided on the first protection layer 190. The first lower pad groups 160 may be formed of or include a conductive material (e.g., copper). The first lower pad groups 160 may include a first lower voltage pad group 161, a first lower dummy pad group 162, and a first lower signal pad group 163. The first lower dummy pad group 162 may be referred to as a lower heat transfer pad group 162.

The second protection layer 150 may be provided on the second surface 110b. First upper pad groups 170 may be provided on the second protection layer 150. The first upper pad groups 170 may be formed of or include a conductive material (e.g., copper). The first upper pad groups 170 may include a first upper voltage pad group 171, a first upper dummy pad group 172, and a first upper signal pad group 173. The first upper dummy pad group 172 may be referred to as an upper heat transfer pad group 172.

The first penetration electrodes 140 may be provided to penetrate the first semiconductor substrate 110. The first penetration electrodes 140 may electrically connect the first lower voltage pad group 161 and the first lower signal pad group 163 to the first upper voltage pad group 171 and the first upper signal pad group 173, respectively.

Connection terminals CN may be provided on the first lower pad group 160. For example, the connection terminals CN may be provided between the first lower pad group 160 of an upper one of the first semiconductor chips 100 and the first upper pad group 170 of a lower one of the first semiconductor chips 100.

Each of the connection terminals CN may be formed of or include at least one of conductive materials (e.g., soldering materials). The connection terminals CN will be described in more detail below.

The first semiconductor substrate 110 of the first semiconductor chip 100t, which is the uppermost one of the first semiconductor chips 100 and 100t, may be thicker than those of the other first semiconductor chips 100. The first semiconductor chip 100t may not include the first upper pad group 170 and the first penetration electrodes 140. In an embodiment, the first semiconductor chip 100t may include the first penetration electrodes 140 but not the first upper pad group 170.

The second semiconductor chip 200 may include a second semiconductor substrate 210, a second interconnection layer 220, second penetration electrodes 240, a third protection layer (not shown), a fourth protection layer 250, second upper pad groups 270, and lower pads 260.

The second upper pad groups 270 may include a second upper voltage pad group 271, a second upper dummy pad group 272, and a second upper signal pad group 273. The lower pads 260 may include signal pads and voltage pads. Package connection terminals 280 may be provided on the lower pads 260, respectively.

The adhesive layer AD may be provided to enclose the connection terminals CN and to prevent an unintended current flow from being produced between the connection terminals CN. In an embodiment, the adhesive layer AD may be a non-conductive film.

Each of regions between adjacent ones of the first semiconductor chips 100 and between the first and second semiconductor chips 100 and 200 adjacent to each other may be referred to as a connection region CR.

In an embodiment, the first lower pad groups 160 of an upper one of the adjacent first semiconductor chips 100, the first upper pad groups 170 of a lower one of the adjacent first semiconductor chips 100, and the connection terminals CN may be placed in the connection region CR between adjacent ones of the first semiconductor chips 100. The connection region CR will be described in more detail below.

Figure 2:
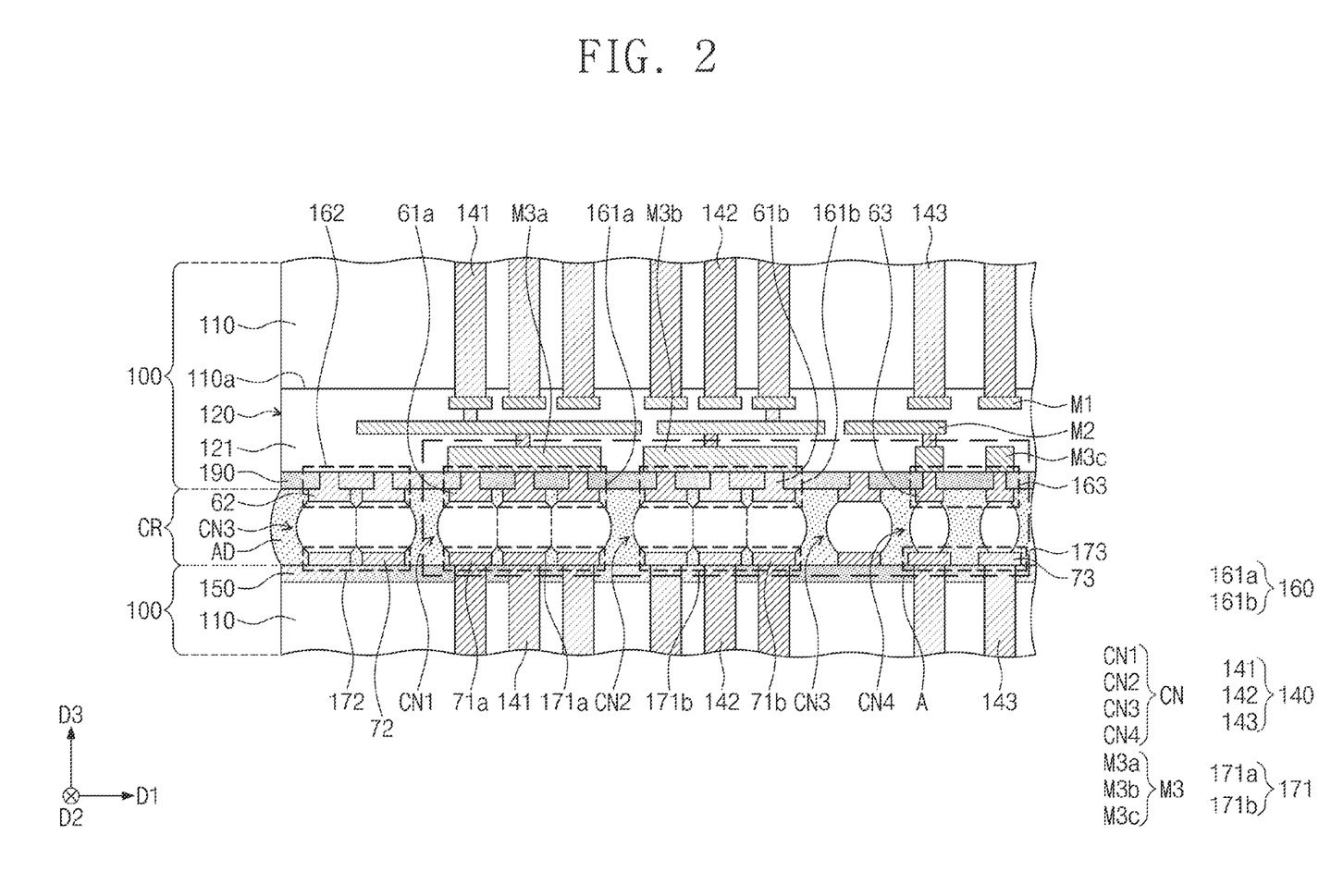
FIG. 2 is an enlarged sectional view illustrating a connection region and its neighboring region in a semiconductor package according to an embodiment of the disclosure.
Figure 3:
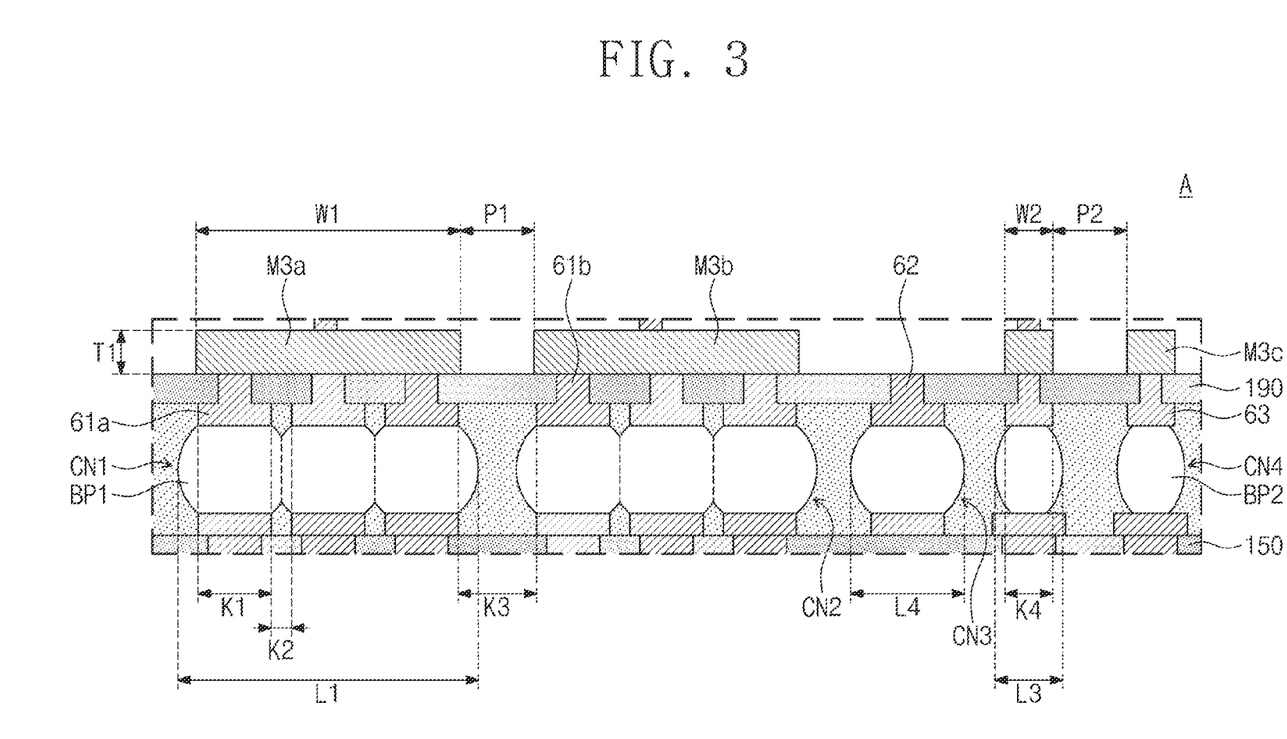
FIG. 3 is an enlarged sectional view illustrating a portion 'A' of FIG. 2.

FIG. 2 is an enlarged sectional view illustrating the connection region CR of FIG. 1 and its neighboring region. FIG. 3 is an enlarged sectional view illustrating a portion 'A' of FIG. 2.

Figure 4:
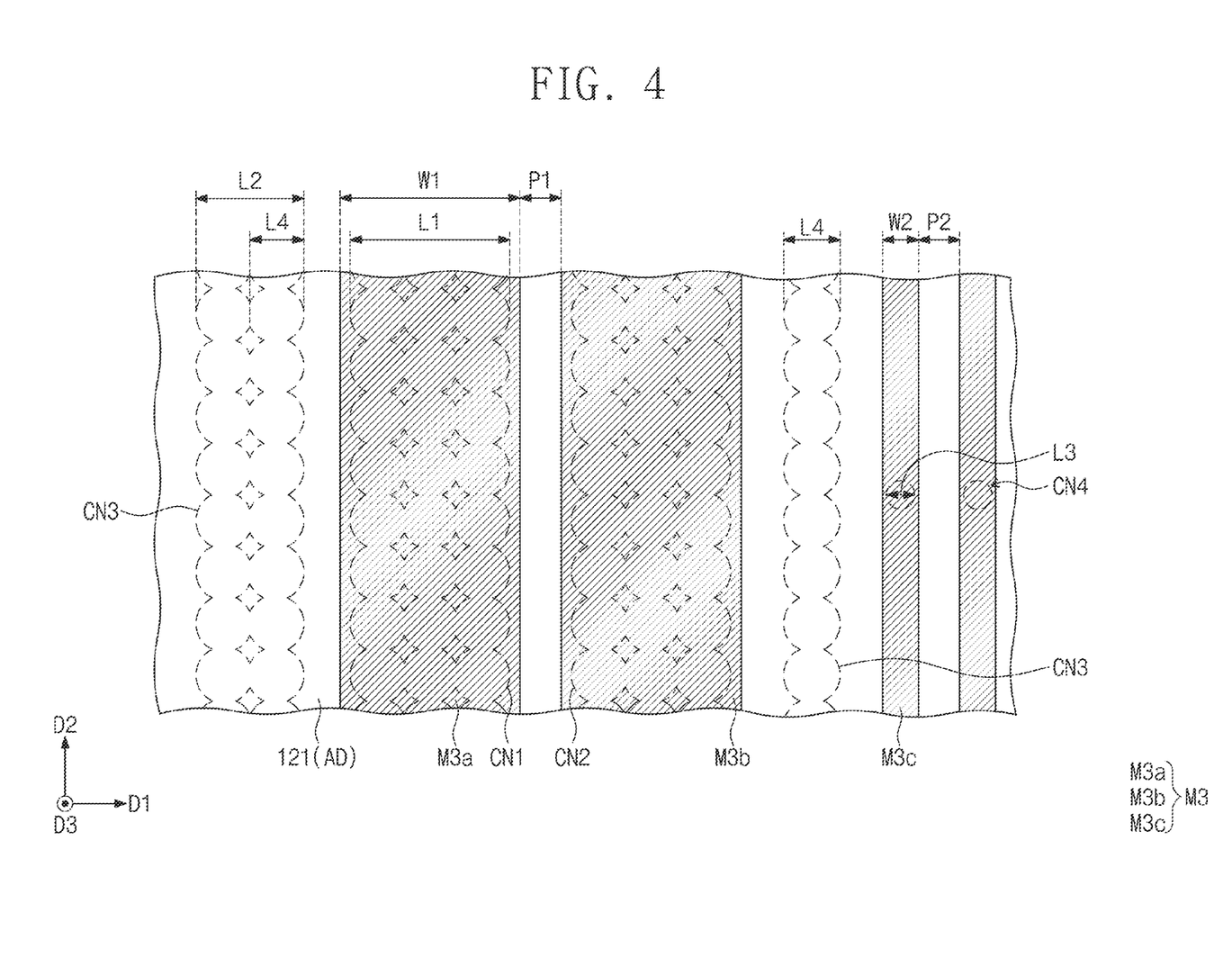
FIG. 4 is a plan view exemplarily illustrating an arrangement of a metal layer and connection terminals of FIG. 2.

FIG. 4 is a plan view exemplarily illustrating an arrangement of a metal layer and connection terminals.

Referring to FIGS. 1 to 3, the first lower voltage pad groups 161 may include a first lower power pad group 161a and a first lower ground pad group 161b. The first lower power pad group 161a may include a plurality of first lower power pads 61a, which are disposed adjacent to each other. The first lower ground pad group 161b may include a plurality of first lower ground pads 61b, which are disposed adjacent to each other. The first lower dummy pad groups 162 may include a plurality of first lower dummy pads 62, which are disposed adjacent to each other. The first lower signal pad group 163 may include a plurality of first lower signal pads 63, which are disposed adjacent to each other.

The first upper voltage pad groups 171 may include a first upper power pad group 171a and a first upper ground pad group 171b. The first upper power pad group 171a may include a plurality of first upper power pads 71a, which are disposed adjacent to each other. The first upper ground pad group 171b may include a plurality of first upper ground pads 71b, which are disposed adjacent to each other. The first upper dummy pad groups 172 may include a plurality of first upper dummy pads 72, which are disposed adjacent to each other. The first upper signal pad group 173 may include a plurality of first upper signal pads 73, which are disposed adjacent to each other.

The first penetration electrodes 140 may include a power penetration electrode 141, a ground penetration electrode 142, and a signal penetration electrode 143. In each of the first semiconductor chips 100, the power penetration electrode 141 may be connected to the first upper power pad 71a and may be connected to the first lower power pad 61a through the interconnection layer 120. In each of the first semiconductor chips 100, the ground penetration electrode 142 may be connected to the first upper ground pad 71b and may be connected to the first lower ground pad 61b through the interconnection layer 120. In each of the first semiconductor chips 100, the signal penetration electrode 143 may be connected to the first upper signal pad 73 and may be connected to the first lower signal pad 63 through the interconnection layer 120.

The interconnection layer 120 may include an insulating layer 121 and metal layers M1, M2, and M3. The metal layers M1, M2, and M3 may be provided in the insulating layer 121. Unlike that illustrated in the drawings, the insulating layer 121 may be composed of a plurality of insulating layers. In an embodiment, the insulating layer 121 may include a silicon oxide layer.

The metal layers M1, M2, and M3 may be extended in a first direction D1 or a second direction D2, which is parallel to the first surface 110a of the first semiconductor substrate 110. The metal layers M1, M2, and M3 may include a first metal layer M1, a second metal layer M2, and a third metal layer M3, which are sequentially stacked on the first surface 110a. Although the metal layers are illustrated to include three metal layers (e.g., M1, M2, and M3), the disclosure is not limited to the number of the metal layers illustrated.

The first metal layer M1 may be in contact with the first penetration electrodes 140. The third metal layer M3 may correspond to a metal layer that is most adjacent to the first lower power pad group 161a, the first lower ground pad group 161b, and the first lower signal pad group 163. Adjacent ones of the first to third metal layers M1 to M3 may be connected to each other through vias interposed therebetween.

The third metal layer M3 may have a thickness that is larger than a thickness of the first metal layer M1 and a thickness of the second metal layer M2. In an embodiment, a thickness T1 of the third metal layer M3 may range from 2 μm to 3 μm.

In an embodiment, the first metal layer M1 and the second metal layer M2 may be formed of or include copper. The third metal layer M3 may be formed of or include, for example, aluminum.

Referring to FIG. 4, the third metal layer M3 may include power lines M3a, ground lines M3b, and signal lines M3c.

The power lines M3a and the ground lines M3b may have a first width W1 in the first direction D1, and the signal lines M3c may have a second width W2 in the first direction D1. In an embodiment, the first width W1 may range from 80 μm to 120 μm. In an embodiment, the second width W2 may range from 8 μm to 12 μm. The first width W1 may be larger than five times the second width W2.

Each of the power lines M3a and each of the ground lines M3b may be extended in the second direction D2, which is parallel to the first surface 110a of the first semiconductor substrate 110 and is not parallel to the first direction D1.

As shown in FIG. 2, the first lower power pad group 161a may be in contact with the power line M3a. That is, the first lower power pads 61a may be in contact with the power line M3a in a many-to-one manner. The first lower ground pad group 161b may be in contact with the ground line M3b. In other words, the first lower ground pads 61b may be in contact with the ground line M3b in a many-to-one manner Each of the first lower signal pads 63 may be in contact with a corresponding one of the signal lines M3c in a one-to-one manner.

The first lower dummy pad group 162 may be spaced apart from the third metal layer M3. Fir, the first lower dummy pads 62 may not be in contact with the third metal layer M3.

The connection terminals CN may include a first connection terminal CN1, a second connection terminal CN2, a third connection terminal CN3, and a fourth connection terminal CN4. The first connection terminal CN1 may be provided between the first lower power pad group 161a of an upper one of the first semiconductor chips 100 and the first upper power pad group 171a of a lower one of the first semiconductor chips 100. The second connection terminal CN2 may be provided between the first lower ground pad group 161b of the upper one of the first semiconductor chips 100 and the first upper ground pad group 171b of the lower one of the first semiconductor chips 100. The third connection terminal CN3 may be provided between the first lower dummy pad group 162 of the upper one of the first semiconductor chips 100 and the first upper dummy pad group 172 of the lower one of the first semiconductor chips 100. The fourth connection terminal CN4 may be provided between each of the first lower signal pads 63 and each of the first upper signal pads 73. The first connection terminal CN1 may be connected to the first lower power pads 61a of the upper one of the first semiconductor chips 100 in a one-to-many manner. In addition, the first connection terminal CN1 may be connected to the first upper power pads 71a of the lower one of the first semiconductor chips 100 in a one-to-many manner.

The second connection terminal CN2 may be connected to the first lower ground pads 61b of the upper one of the first semiconductor chips 100 in a one-to-many manner. Furthermore, the second connection terminal CN2 may be connected to the first upper ground pads 71b of the lower one of the first semiconductor chips 100 in a one-to-many manner.

The third connection terminal CN3 may be connected to the first lower dummy pads 62 of the upper one of the first semiconductor chips 100 in a one-to-many manner. Furthermore, the third connection terminal CN3 may be connected to the first upper dummy pads 72 of the lower one of the first semiconductor chips 100 in a one-to-many manner.

A portion of each of the first lower dummy pads 62 may be in contact with the third connection terminal CN3 and the remaining portion may be in contact with the insulating layer 121 and the first protection layer 190.

The fourth connection terminal CN4 may be connected to each of the first lower signal pads 63 of the upper one of the first semiconductor chips 100 in a one-to-one manner. Furthermore, the fourth connection terminal CN4 may be connected to the upper signal pads 73 of the lower one of the first semiconductor chips 100 in a one-to-one manner.

Each of the first to third connection terminals CN1 to CN3 may have a structure that is composed of merged bumps.

Referring to FIGS. 3 and 4, the power line M3a and the ground line M3b may be extended in the second direction D2 and may be spaced apart from each other by a first separation distance P1 in the first direction D1. In an embodiment, the power line M3a and the ground line M3b may be alternately arranged. In an embodiment, the first separation distance P1 may be about 20 μm. The first separation distance P1 may be smaller than the first width W1.

The signal lines M3c may be extended in the second direction D2 and may be spaced apart from each other by a second separation distance P2 in the first direction D1. In an embodiment, the second separation distance P2 may be about 20 μm. The second separation distance P2 may be larger than the second width W2.

The first connection terminal CN1 may be vertically overlapped with the power line M3a. The second connection terminal CN2 may be vertically overlapped with the ground line M3b. The fourth connection terminal CN4 may be vertically overlapped with the signal line M3c.

The third connection terminal CN3 may be disposed to be vertically overlapped with a region, on which the power line M3a, the ground line M3b, and the signal line M3c are not disposed. As an example, the third connection terminal CN3 may be disposed between the power line M3a and the ground line M3b or may be disposed to be vertically overlapped with a region between the power or ground line M3a or M3b and the signal line M3c.

The first and second connection terminals CN1 and CN2 may have a width L1 in the first direction DE In the case where the first and second connection terminals CN1 and CN2 are extended in the second direction D2, the width L1 in the first direction D1 may be the smallest width. In the case where the third connection terminal CN3 is extended in the second direction D2, a width L2 in the first direction D1 may be the smallest width. The smallest widths of the first to third connection terminals CN1 to CN3 may be larger than the largest width of the fourth connection terminal CN4. When measured at the same level, the widths L1 and L2 of the first to third connection terminals CN1 to CN3 may be larger than a width L3 of the fourth connection terminal CN4. An aspect ratio of each of the first to third connection terminals CN1 to CN3 may be smaller than an aspect ratio of the fourth connection terminal CN4. In the present specification, the aspect ratio may mean a value obtained by dividing a thickness or height (i.e., a length in a third direction D3) of an object by a width of the object in the first or second direction D1 or D2. The smallest width L1 or L2 of the first to third connection terminals CN1 to CN3 may be substantially equal to the largest diameter of a first bump BP1. The fourth connection terminal CN4 may be a second bump BP2. A diameter L4 of the first bump BP1 may be larger than the largest diameter of the second bump BP2.

In the first lower power pad group 161a, a separation distance K2 between the first lower power pads 61a may be smaller than a diameter of each of the first lower power pads 61a. Furthermore, the first upper power pad group 171a, the first lower ground pad group 161b, the first upper ground pad group 171b, the first lower dummy pad group 162, and the first upper dummy pad group 172 may also be configured to have the same distance-diameter relationship as that in the first lower power pad group 161a; that is, in each group, a separation distance between pads may be smaller than a diameter of each pad.

As a result, adjacent ones of the first bumps BP1 may be in contact with each other and may be easily combined with each other, when the first bumps BP1 are reflowed on the first lower power pads 61a, the first lower ground pads 61b, and the first lower dummy pads 62 or when the first semiconductor chips 100 are attached to each other.

The first lower power pad group 161a may be spaced apart from the first lower ground pad group 161b adjacent thereto by a separation distance K3, and here, the separation distance K3 may be equal to or larger than a diameter K1 of the first lower power pad 61a. As a result, in the case where adjacent ones of the first bumps BP1 are merged to form the first connection terminal CN1 and the second connection terminal CN2, the first and second connection terminals CN1 and CN2 may not be in contact with each other.

Other pad groups may be configured to have the same relationship; for example, a separation distance between different pad groups may be equal to or larger than a diameter of each pad. A diameter K4 of the first lower signal pad 63 may be smaller than the diameter K1 of the first lower power pad 61a. The diameter K4 of the first lower signal pad 63 may be smaller than a diameter of the first lower ground pad 61b and a diameter of the first lower dummy pad 62. In addition, the diameter K4 of the first lower signal pad 63 may be smaller than or equal to a distance to another first lower signal pad 63 adjacent thereto. As a result, it may be possible to prevent adjacent ones of the fourth connection terminals CN4 from being in contact with each other in a process of forming the fourth connection terminal CN4.

According to an embodiment of the disclosure, a first lower power pad group and a first lower ground pad group may be connected to a power line and a ground line, respectively, which have a large area and a large thickness. First lower power pads in the first lower power pad groups may be coupled to a first connection terminal in a many-to-one manner, and first lower ground pads in first lower ground pad groups may be coupled to a second connection terminal in a many-to-one manner. Furthermore, a first lower dummy pad group may be disposed on a region, in which the power line and the ground line are not disposed, and first lower dummy pads may be coupled to a third connection terminal in a many-to-one manner. That is, since the first and second connection terminals are provided to have an increased area, a heat transfer process from a lower one of the first semiconductor chips toward an upper one of the first semiconductor chips may be effectively performed. In addition, since the third connection terminal is disposed on an unused area, the heat transfer process may be more effectively performed. As a result, it may be possible to improve efficiency of an upward heat transfer process in a semiconductor chip stack or to reduce a thermal resistance of the semiconductor package in a vertical direction.

Figure 5:
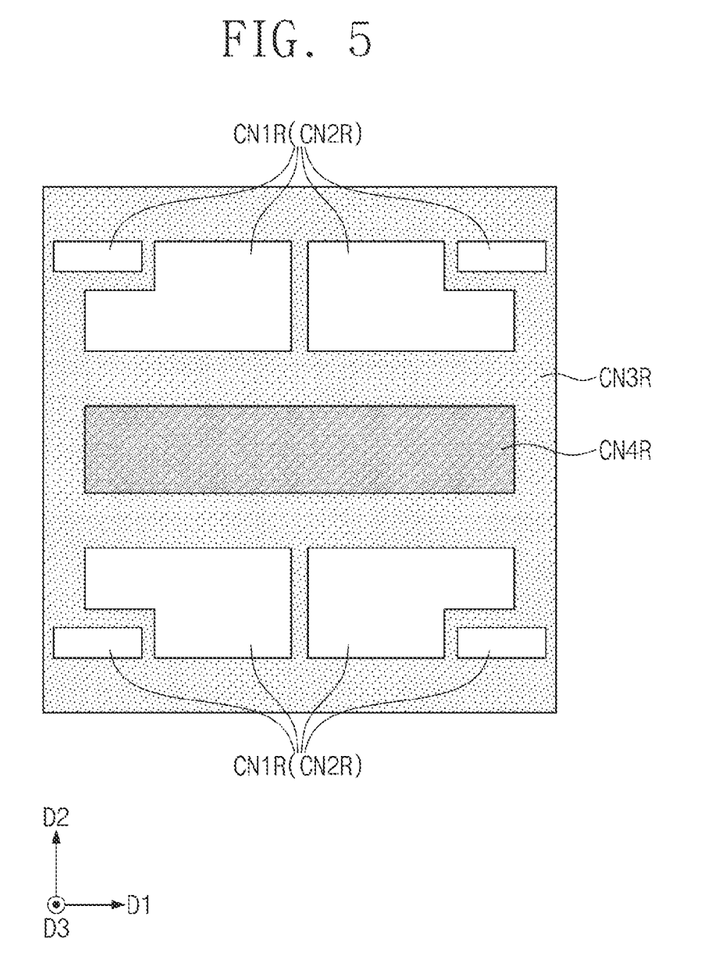
FIG. 5 is a plan view schematically illustrating a region provided with connection terminals.

FIG. 5 is a plan view schematically illustrating an arrangement of the connection terminals.

Referring to FIG. 5, a first connection terminal region CN1R or a second connection terminal region CN2R may be disposed on a bottom surface of the first semiconductor chip 100. In an embodiment, a fourth connection terminal region CN4R may be disposed on a center portion of the first semiconductor chip. A region, on which the first or second connection terminal region CN1R or CN2R and the fourth connection terminal region CN4R are not disposed, may serve as a third connection terminal region CN3R, on which the third connection terminal CN3 is disposed. In an embodiment, the third connection terminal region CN3R may account for 20% to 50% of a planar area.

Figure 6:
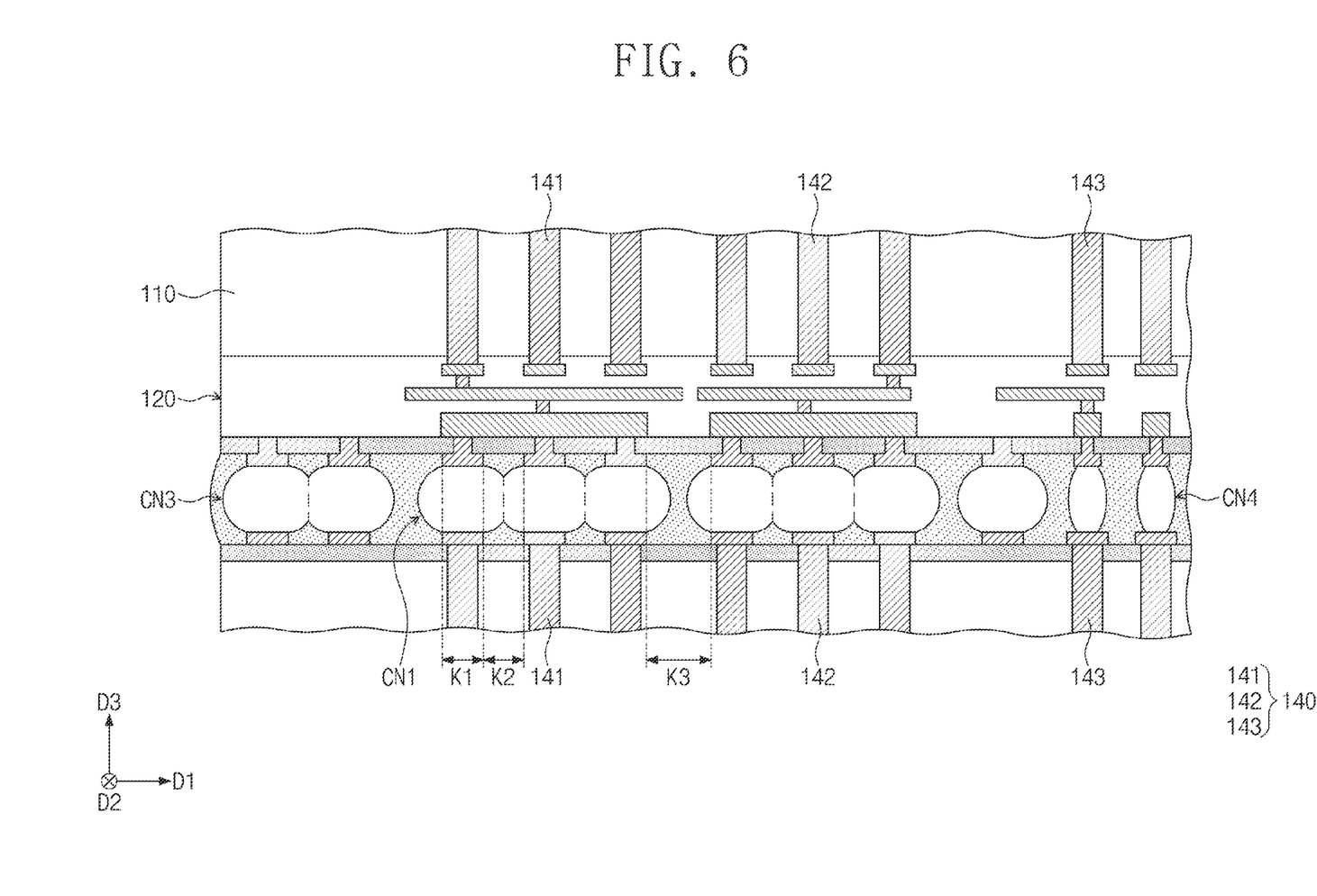
FIG. 6 is an enlarged sectional view illustrating a connection region and its neighboring region in a semiconductor package according to an embodiment of the disclosure.

FIG. 6 is an enlarged sectional view illustrating a connection region and its neighboring region according to an embodiment of the disclosure. Except for features to be described below, the package according to the present embodiment may have substantially the same features as those described with reference to FIGS. 1 to 5, and thus, an overlapping description thereof may be omitted.

A separation distance K2 between first lower voltage pads 61, which are adjacent to each other in the first lower power pad group 161a, may be equal to or larger than a diameter K1 of each of the first lower voltage pads 61. A separation distance K3 between the first lower power and ground pad groups 161a and 1661b may be larger than the separation distance K2 between adjacent ones of the first lower voltage pads 61. In this case, a diameter of each first bump BP1 constituting the first connection terminal CN1 may be larger than 1.5 times a diameter of the first lower voltage pad 61.

Figure 7:
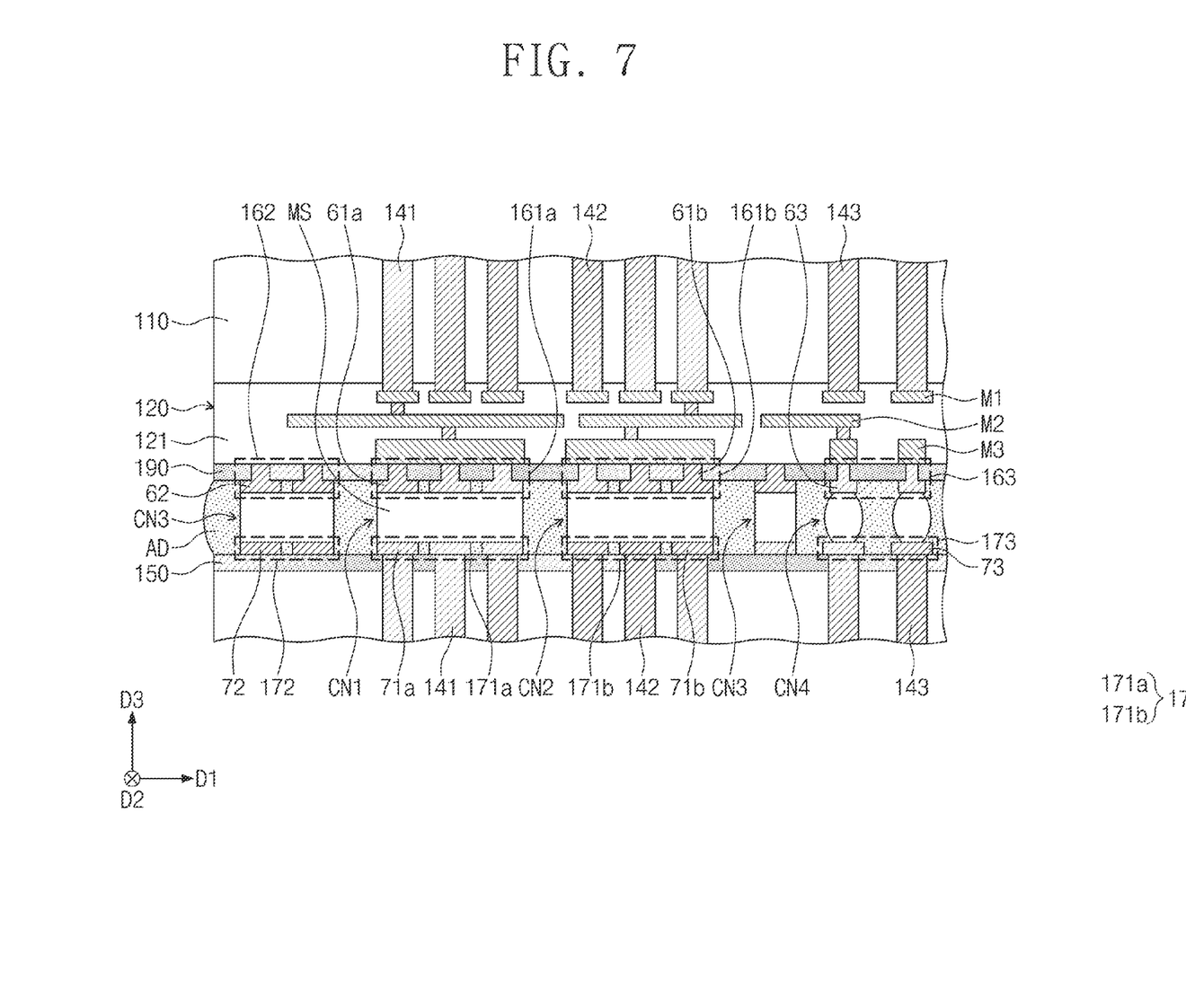
FIG. 7 is an enlarged sectional view illustrating a connection region and its neighboring region in a semiconductor package according to an embodiment of the disclosure.

FIG. 7 is an enlarged sectional view illustrating a connection region and its neighboring region according to an embodiment of the disclosure. Except for features to be described below, the package according to the present embodiment may have substantially the same features as those described with reference to FIGS. 1 to 5, and thus, an overlapping description thereof may be omitted.

Referring to FIG. 7, each of the first to third connection terminals CN1 to CN3 may include a metal structure MS. In an embodiment, the metal structure MS may be formed of or include copper. The metal structure MS may have a rectangular shape, when viewed in a sectional view. Some of the metal structures MS may be vertically overlapped with the power line M3a and the ground line M3b. The fourth connection terminal CN4 may include a bump.

Figure 8:
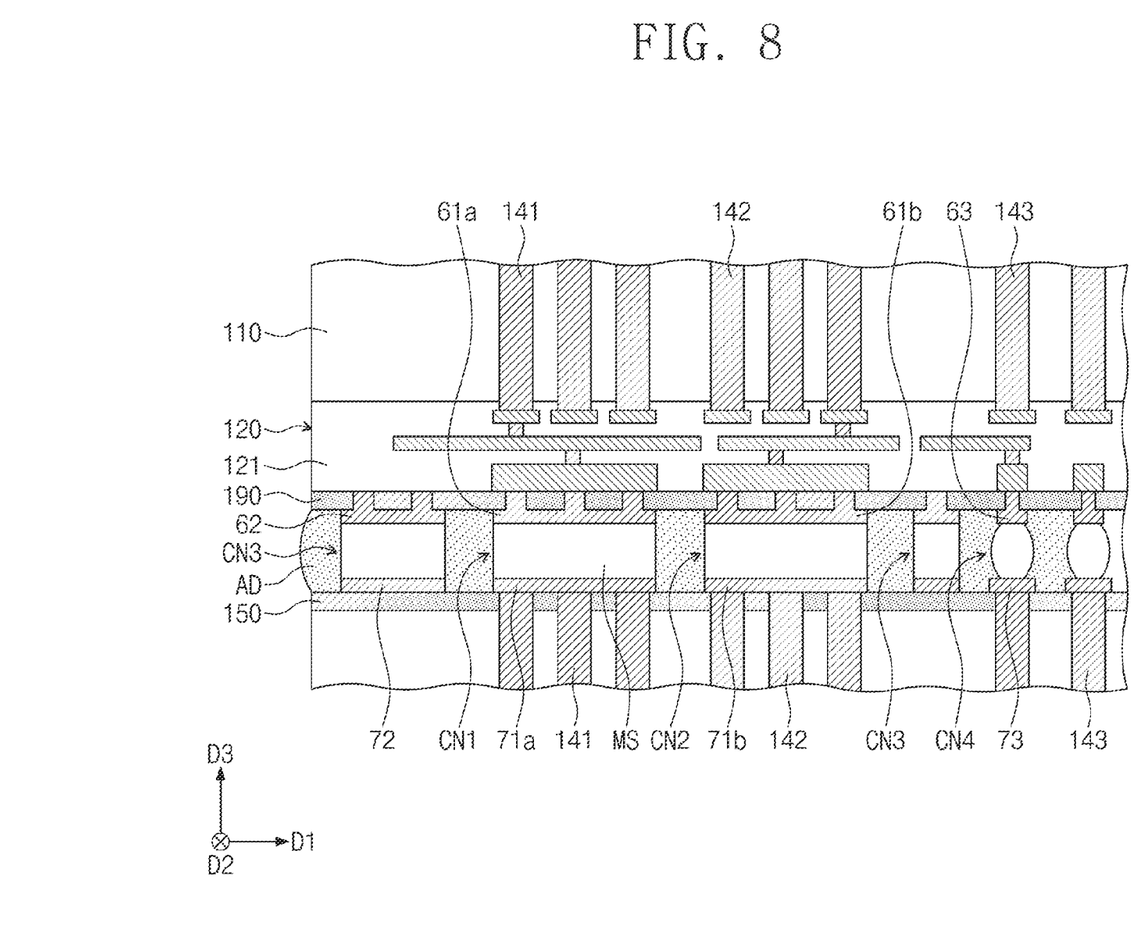
FIG. 8 is an enlarged sectional view illustrating a connection region and its neighboring region in a semiconductor package according to an embodiment of the disclosure.

FIG. 8 is an enlarged sectional view illustrating a connection region and its neighboring region according to an embodiment of the disclosure. Except for features to be described below, the package according to the present embodiment may have substantially the same features as those described with reference to FIGS. 1 to 5, and thus, an overlapping description thereof may be omitted.

Referring to FIG. 8, each of the first lower power pad 61a, the first lower ground pad 61b, and the first lower dummy pad 62 may be provided to include a plurality of vias. The first upper power pad 71a may be provided to be in contact with a plurality of power penetration electrodes 141 in a one-to-many manner, and the first upper ground pad 71b may be provided to be in contact with a plurality of ground penetration electrodes 142 in a one-to-many manner. The first upper dummy pad 72 may have a size corresponding to the first lower dummy pad 62.

The metal structure MS may be provided between each corresponding pair of the first lower power pad 61a, the first lower ground pad 61b, and the first lower dummy pad 62 of the upper one of the first semiconductor chips 100 and the first upper power pad 71a, the first upper ground pad 71b, and the first upper dummy pad 72 of the lower one of the first semiconductor chips 100.

Figure 9:
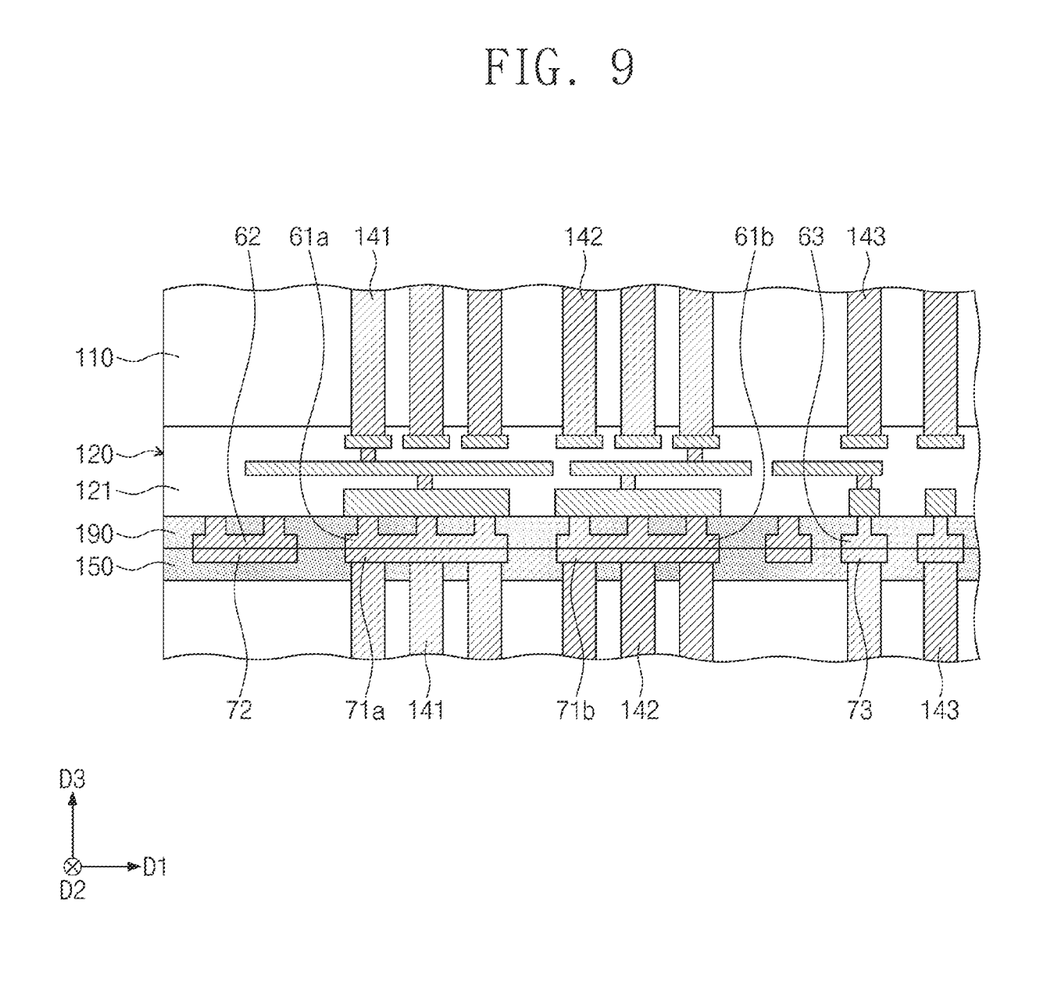
FIG. 9 is an enlarged sectional view illustrating a connection region and its neighboring region in a semiconductor package according to an embodiment of the disclosure.

FIG. 9 is an enlarged sectional view illustrating a connection region and its neighboring region according to an embodiment of the disclosure. Except for features to be described below, the package according to the present embodiment may have substantially the same features as those described with reference to FIGS. 1 to 5, and thus, an overlapping description thereof may be omitted.

Referring to FIG. 9, the first lower power pad 61a of the upper one of the first semiconductor chips 100 may be in contact with the first upper power pad 71a of the lower one of the first semiconductor chips 100. The first lower ground pad 61b of the upper one of the first semiconductor chips 100 may be in contact with the first upper ground pad 71b of the lower one of the first semiconductor chips 100. The first lower dummy pad 62 of the upper one of the first semiconductor chips 100 may be in contact with the first upper dummy pad 72 of the lower one of the first semiconductor chips 100. The first lower signal pad 63 of the upper one of the first semiconductor chips 100 may be in contact with the first upper signal pad 73 of the lower one of the first semiconductor chips 100.

Figure 10:
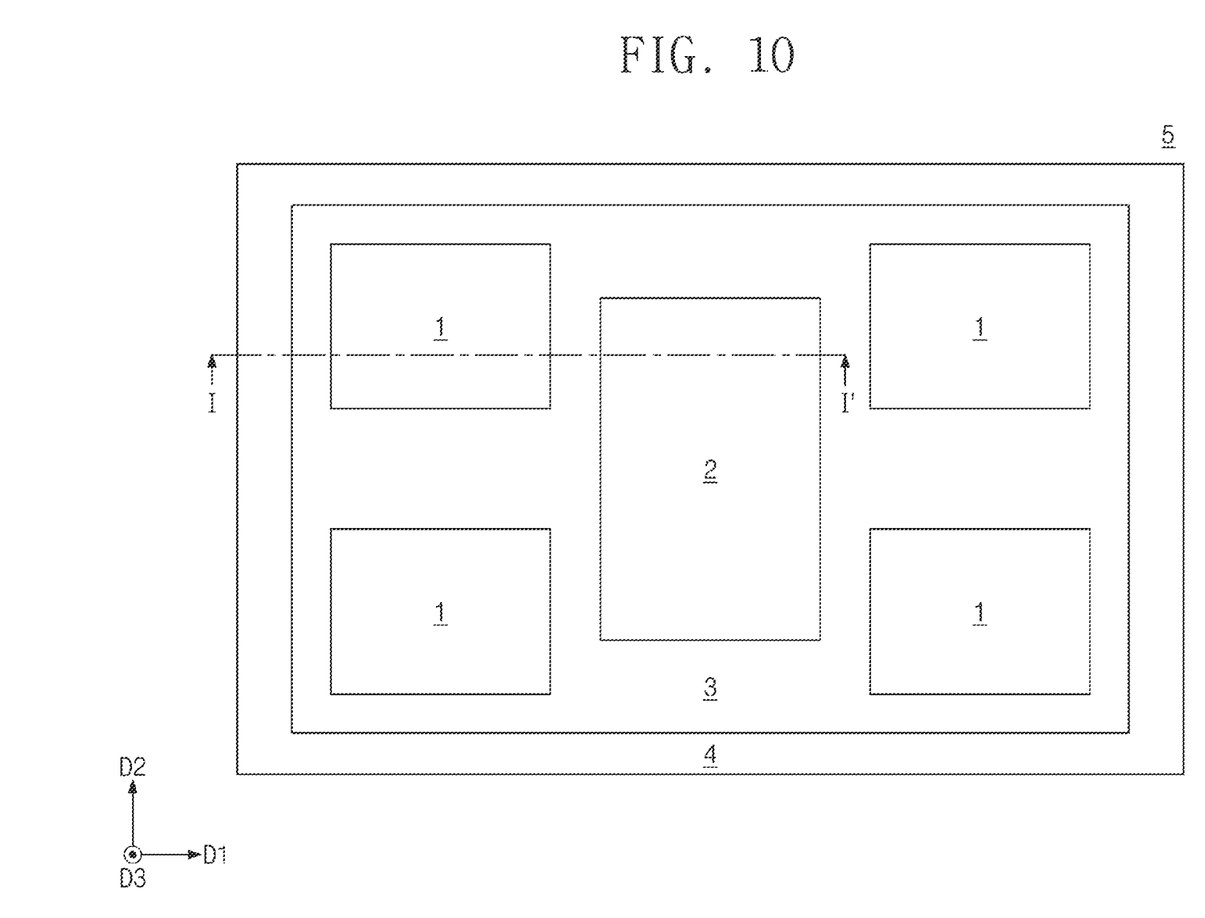
FIG. 10 is a plan view illustrating a semiconductor package according to an embodiment of the disclosure.
Figure 11:
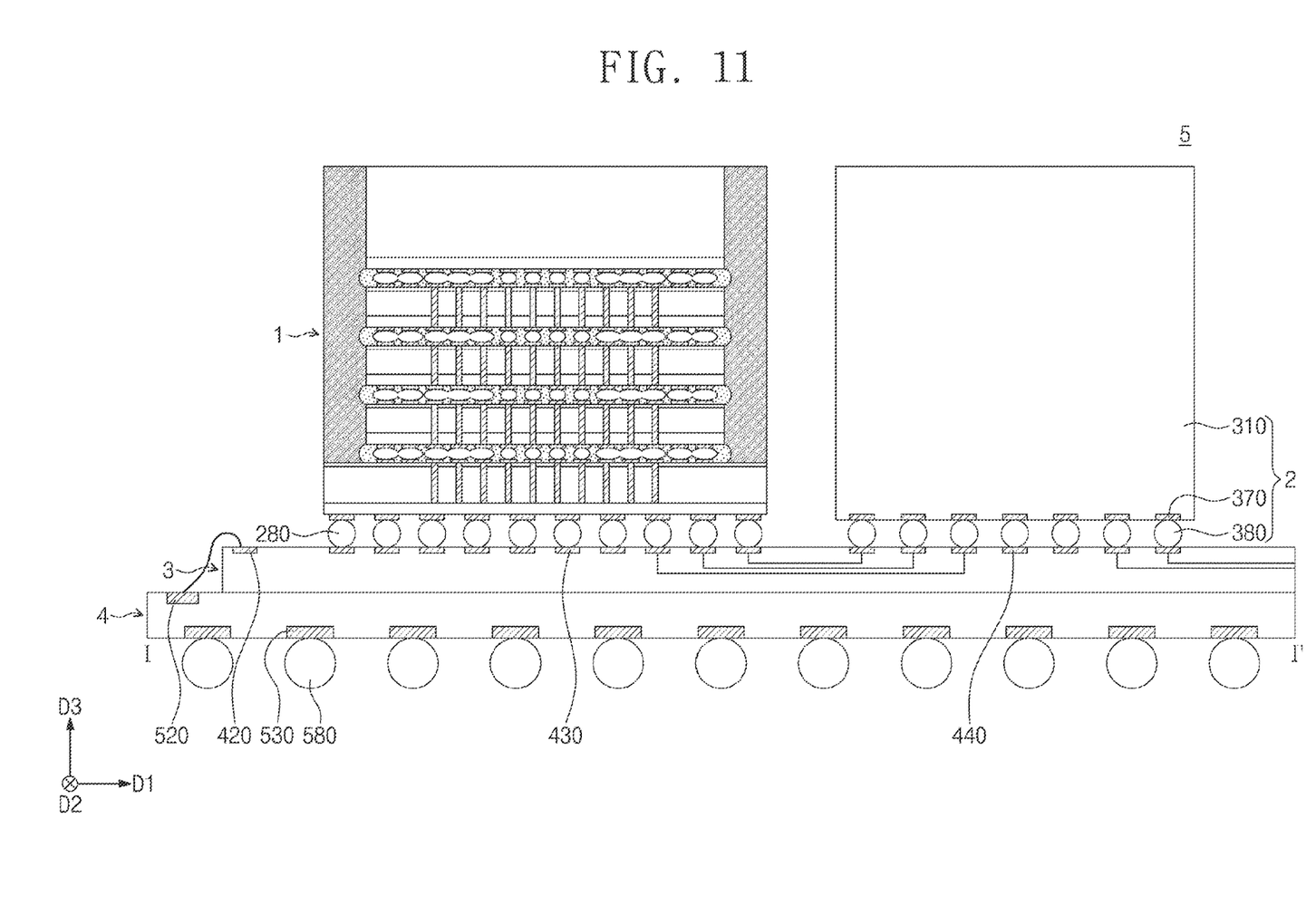
FIG. 11 is a sectional view taken along a line I-I' of FIG. 10.

FIG. 10 is a plan view illustrating a semiconductor package 5 according to an embodiment of the disclosure. FIG. 11 is a sectional view taken along a line I-I' of FIG. 10.

Referring to FIGS. 10 and 11, the semiconductor package 5 may include a package substrate 4, an interposer 3, a semiconductor chip stack 1, and a third semiconductor chip 2. In an embodiment, a plurality of the semiconductor chip stacks 1 may be provided. For example, two semiconductor chip stacks 1 may be provided on each of two opposite sides of the third semiconductor chip 2; that is, four semiconductor chip stacks 1 may be provided in total around the third semiconductor chip 2.

In an embodiment, the package substrate 4 may be a printed circuit board. The interposer 3 may be a silicon interposer or a redistribution interposer.

The third semiconductor chip 2 may be a logic chip. The third semiconductor chip 2 may include a third substrate 310. The third substrate 310 may have a surface, which faces the interposer 3 and serves as an active surface provided with a circuit layer. Lower pads 370 may be provided on the active surface. Connection terminals 380 may be provided on the lower pads 370.

The interposer 3 may include a first pad 430 and a second pad 440. The package connection terminal 280 may be connected to the first pad 430. The connection terminals 380 may be connected to the second pads 440. The third semiconductor chip 2 and the semiconductor chip stack 1 may be electrically connected to each other through the interposer 3.

The interposer 3 may include a third pad 420 and may be connected to the package substrate 4 through the third pad 420 and a connection element (e.g., a bonding wire or TSV). The package substrate 4 may include an upper pad 520 and a lower pad 530. An outer connection terminal 580 may be provided on the lower pad 530. The package substrate 4 may be electrically connected to an external board (e.g., a motherboard) through the outer connection terminal 580.

According to an embodiment of the disclosure, a first connection terminal, a second connection terminal, and a third connection terminal, which are connected to voltage pads, ground pads, and dummy pads, respectively, in a one-to-many manner, may be provided between stacked semiconductor chips. The first and second connection terminals may be connected to a thick metal layer of a semiconductor chip placed thereon. Thus, the first and second connection terminals may be used to effectively exhaust heat, which is generated from an underlying semiconductor chip, in an upward direction. Furthermore, due to the presence of the third connection terminal, the heat dissipation process may be more effectively performed. As a result, it may be possible to reduce a thermal resistance of a semiconductor package in a vertical direction.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments of the disclosure have been particularly shown and described, it will be understood by one of ordinary skill in the art that variations in form and detail may be made therein without departing from the spirit and scope of the attached claims.

What is claimed is:

1. A semiconductor package comprising:
a plurality of semiconductor chips vertically stacked; and
a first connection terminal, a second connection terminal, and a third connection terminal connecting the semiconductor chips to each other, wherein:
each of the semiconductor chips comprises:
a semiconductor substrate including a first surface and a second surface, which are opposite to each other;
an interconnection layer provided on the first surface of the semiconductor substrate;
a plurality of penetration electrodes provided to penetrate the semiconductor substrate and connected to the interconnection layer; and
a first pad group, a second pad group, and a third pad group provided on the interconnection layer,
the interconnection layer comprises:
an insulating layer; and
a first metal layer and a second metal layer, which are vertically stacked on the first surface of the semiconductor substrate and in the insulating layer,
a thickness of the second metal layer is larger than a thickness of the first metal layer, the first pad group and the second pad group are in contact with the second metal layer,
the third pad group is spaced apart from the second metal layer,
the first pad group comprises a plurality of first pads,
the first connection terminal is connected to the first pads in a one-to-many manner,
the second pad group comprises a plurality of second pads,
the second connection terminal is connected to a corresponding one of the second pads in a one-to-one manner,
the third pad group comprises a plurality of third pads, and
the third connection terminal is connected to the third pads in a one-to-many manner.

2. The semiconductor package of claim 1, wherein:
the second metal layer comprises a first wire and second wires,
the first wire has a first width in a first direction parallel to the first surface of the semiconductor substrate,
each of the second wires has a second width in the first direction,
the first width is larger than 5 times the second width,
the first pads are in contact with the first wire in a many-to-one manner, and
each of the second pads is in contact with a corresponding one of the second wires in a one-to-one manner.

3. The semiconductor package of claim 1, wherein each of the first and third connection terminals is provided to have a structure in which plurality of bumps are merged.

4. The semiconductor package of claim 1, wherein:
the first and third connection terminals comprise a metal structure, and
the metal structure has a rectangular section.

5. The semiconductor package of claim 1, wherein a diameter of each of the first pads in the first pad group is larger than a separation distance between adjacent ones of the first pads.

6. The semiconductor package of claim 5, wherein:
the first pad group is disposed adjacent to the third pad group, and
a separation distance between the first pad group and the third pad group is larger than or equal to a diameter of each of the first pads.

7. The semiconductor package of claim 1, wherein when measured at the same level, each of widths of the first and third connection terminals in a first direction parallel to the first surface is larger than a width of the second connection terminal in the first direction.

8. The semiconductor package of claim 1, further comprising:
a protection layer interposed between the interconnection layer and the first, second, and third pad groups, wherein
the protection layer comprises an insulating material.

9. The semiconductor package of claim 8, wherein each of the third pads comprises two portions, one of which is in contact with the third connection terminal and another of which is in contact with the protection layer and the insulating layer.

10. The semiconductor package of claim 1, wherein the third connection terminal is provided to cover 20% to 50% of an area of the semiconductor substrate, when viewed in a plan view.

11. A semiconductor package comprising:
a first semiconductor chip;

a second semiconductor chip on the first semiconductor chip; and
a connection region between the first semiconductor chip and the second semiconductor chip, wherein:
the first semiconductor chip comprises a plurality of first penetration electrodes and a plurality of second penetration electrodes,
the second semiconductor chip comprises an interconnection layer adjacent to the first semiconductor chip,
the interconnection layer comprises:
an insulating layer; and
a first metal layer and a second metal layer, which are vertically stacked in the insulating layer, the second metal layer being thicker than the first metal layer,
the connection region comprises:
lower voltage pads and lower signal pads, which are adjacent to the second semiconductor chip and are in contact with the second metal layer;
lower dummy pads, which are adjacent to the second semiconductor chip and are spaced apart from the second metal layer;
upper voltage pads, which are adjacent to the first semiconductor chip and are connected to the first penetration electrodes in a one-to-many manner;
upper signal pads, which are adjacent to the first semiconductor chip and are connected to the second penetration electrodes in a one-to-one manner; and
upper dummy pads, which are adjacent to the first semiconductor chip and are spaced apart from the first and second penetration electrodes, and
the lower dummy pads adjacent to the second semiconductor chip are connected to the upper dummy pads adjacent to the first semiconductor chip.

12. The semiconductor package of claim 11, further comprising:
a connection terminal provided between the lower dummy pads of the second semiconductor chip and the upper dummy pads of the first semiconductor chip, wherein the connection terminal is extended along a top surface of the lower dummy pad of the second semiconductor chip and a bottom surface of the upper dummy pad of the first semiconductor chip.

13. The semiconductor package of claim 12, wherein the connection terminal comprises a metal structure having a rectangular section.

14. The semiconductor package of claim 11, wherein the upper dummy pads of the first semiconductor chip and the lower dummy pads of the second semiconductor chip are in contact with each other.

15. A semiconductor package comprising:
a package substrate;
an interposer on the package substrate;
a first semiconductor chip on the interposer; and
a package disposed adjacent to the first semiconductor chip, wherein:
the package comprises:
a plurality of second semiconductor chips which are vertically stacked; and
a first connection terminal, a second connection terminal, a third connection terminal, and fourth connection terminals connecting the second semiconductor chips to each other,
each of the second semiconductor chips comprises:
a semiconductor substrate;
a plurality of penetration electrodes provided to penetrate the semiconductor substrate;
an interconnection layer provided on a surface of the semiconductor substrate; and
a signal pad group, a power pad group, a ground pad group, and a dummy pad group provided on the interconnection layer, the signal pad group, power pad group, ground pad group, and dummy pad group comprising signal pads, power pads, ground pads, and dummy pads, respectively,
the first connection terminal is in contact with the power pads in a one-to-many manner,
the second connection terminal is in contact with the ground pads in a one-to-many manner,
the third connection terminal is in contact with the dummy pads in a one-to-many manner,
each of the fourth connection terminals is in contact with a corresponding one of the signal pads in a one-to-one manner, and
an aspect ratio of one of the first to third connection terminals is smaller than an aspect ratio of the fourth connection terminal.

16. The semiconductor package of claim 15, wherein a diameter of each of the dummy pads in the dummy pad group is larger than a separation distance between adjacent ones of the dummy pads.

17. The semiconductor package of claim 16, wherein:
the dummy pad group is disposed adjacent to the ground pad group, and
a separation distance between the dummy pad group and the ground pad group is larger than or equal to a diameter of each of the dummy pads.

18. The semiconductor package of claim 15, wherein:
the interconnection layer comprises:
an insulating layer; and
a first metal layer and a second metal layer, which are vertically stacked on a first surface of the semiconductor substrate and in the insulating layer,
a thickness of the second metal layer is larger than a thickness of the first metal layer,
the signal pad group, the power pad group, and the ground pad group are in contact with the second metal layer, and
the dummy pad group is spaced apart from the second metal layer.

19. The semiconductor package of claim 15, wherein each of the first to third connection terminals is provided to have a structure in which plurality of bumps are merged.

20. The semiconductor package of claim 15, wherein:
each of the first to third connection terminals comprises a metal structure, and
the metal structure has a rectangular section.

* * * * *